US 6,760,891 B2

(12) United States Patent
Chng

(10) Patent No.: US 6,760,891 B2
(45) Date of Patent: Jul. 6, 2004

(54) SIMULATOR OF DYNAMIC CIRCUIT FOR SILICON CRITICAL PATH DEBUG

(75) Inventor: Choon Ping Chng, Sunnyvale, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 127 days.

(21) Appl. No.: 10/113,423

(22) Filed: Apr. 1, 2002

(65) Prior Publication Data

US 2003/0192014 A1 Oct. 9, 2003

(51) Int. Cl.[7] .............................................. G06F 17/50
(52) U.S. Cl. ........................ 716/4; 716/1; 716/2; 716/6
(58) Field of Search .............................. 716/1, 2, 4, 6, 716/18; 714/738

(56) References Cited

U.S. PATENT DOCUMENTS 6,195,776 B1 * 2/2001 Ruiz et al. .................. 714/738
6,594,800 B2 * 7/2003 Chang et al. ................... 716/1

* cited by examiner

Primary Examiner—Vuthe Siek
Assistant Examiner—Thuan Do
(74) Attorney, Agent, or Firm—Hamilton & Terrile, LLP; Stephen A. Terrile

(57) ABSTRACT

An abstract register transfer level (RTL) model that simulates behavior of a dynamic circuit is created. The model is built upon an existing RTL with another level of abstraction capturing input transitions.

15 Claims, 4 Drawing Sheets

SIMULATOR OF DYNAMIC CIRCUIT FOR SILICON CRITICAL PATH DEBUG

BACKGROUND OF THE INVENTION

1. Field of the Invention

The invention relates to determining operating characteristics of integrated circuit chips, and more particularly to determining the operating characteristics of dynamic circuits within integrated circuit chips.

2. Description of the Related Art

Digital logic circuits are implemented using various electronic technologies. Commonly used electronic technologies include metal oxide semi-conductor (MOS) technology, particularly complimentary MOS (CMOS) technology. CMOS technology is common in static circuits. FIG. 1A shows a circuit diagram of a static CMOS transistor circuit, specifically a logical NAND gate. An input A 100 and input B 105 are received by the circuit. Only if input A 100 and input B 105 are high (i.e., both have values of "1") is the value at output OUT 100 low (i.e., a value of "0"). All other input conditions to input A 100 and input B 105 result in a high output value.

Although designed initially for static circuits, CMOS technology has been implemented into dynamic circuits. Dynamic circuits essentially operate in conjunction with a clock pulse signal. FIG. 1B is a diagram illustrating a dynamic circuit, specifically a logical NAND gate. An input A 120 and input B 125 along with a clock signal 130 are received by the circuit. Only if input A 120, input B 125, and the clock signal 130 are high is OUT 135 low. When the clock signal 130 is low, output OUT 135 is high regardless of the state of input A 120 and of input A 130. However, in a dynamic circuit OUT is only valid when the clock is high. When the clock signal is high and either or both input A 120 and input B 130 is low, then the output OUT is high.

Dynamic circuits are faster than static circuits because dynamic circuits allow setting up gates in a cascade or domino arrangement. Information arrives down the cascade of gates at full speed, similar to a row of falling dominos. For cascaded gates no stage transition can occur until any predecessor stage transition occurs. For dynamic circuits, when the clock signal is high, the clock signal is considered to be in "evaluation phase." When the clock signal is low, the clock signal is considered to be in "pre-charged phase." By having a pre-charge phase set to low, multiple circuits or logic stages can use a single clock signal. A common clock signal is used by a number of circuits, sub-systems, systems, and devices.

For a dynamic circuit to properly operate, falling edge transitions are not allowed for any gate inputs during the evaluation phase. Such a transition will potentially generate an error in the dynamic circuit, and can lead to an error in the system or device in which the dynamic circuit resides. Since clock frequencies relate to the number of times per second a clock pulse switches from high (evaluation phase) to low (pre-charge phase), relatively lower frequencies allow sufficient time for the input to settle before the dynamic circuit enters the evaluation phase. As operating frequency is increased, the likelihood of experiencing the transitioning problem also increases as these transitions are unable to settle before the available clock arrives, violating the input setup time of the dynamic circuit and eventually reaching an operating frequency where the dynamic circuit can not operate.

Integrated circuit (IC) chips can contain a number of static and dynamic circuits. IC chips can also be part of a larger system or device. Once an IC chip is fabricated into silicon, a thorough understanding of the interrelationship between intra-chip, intra-system, and intra-device signals is desirable. An important step in the understanding of the interrelationship involves debugging a particular dynamic circuit and understanding critical path and critical clock frequencies affecting the dynamic circuit.

When various circuits and systems depend upon inputs and provide outputs to other dynamic circuits and static circuits, determining circuit behavior, in particular operating frequency is important in troubleshooting and debugging of systems, specifically IC chips.

Determining the maximum frequency in which an IC chip can operate depends on at what frequencies circuits within the IC chip can functionally operate. Typically, guesses are made as to the critical frequencies and critical paths that relate to dynamic circuits. Further, when IC chips are integrated into larger systems, failure analysis becomes important in determining causes or potential causes of failures of subsystems, devices, or circuits of the larger system.

SUMMARY OF THE INVENTION

Accordingly, accurately, effectively, and quickly identifying the silicon behavior of dynamic circuit when the setup time to the dynamic circuit input is violated is desirable. An abstract register transfer level (RTL) model that simulates behavior of a dynamic circuit is created. The model is built upon an existing RTL with another level of abstraction capturing input transitions.

In one embodiment, the invention relates to modeling a dynamic circuit. The modeling determines a previous input value, a next input value and combines the previous input value and the next input value to generate a modeled input value. The modeling additionally models an expected output value based upon the modeled input value.

In another embodiment, the invention relates to modeling a dynamic circuit. The modeling determines first and second previous input and output values. The modeling combines a first previous input value and the first next input value to generate a first modeled input value. Additionally, the modeling combines a second previous input value and a second next input value to generate a second modeled input value. The modeled first and second expected output values are based upon the first and second modeled input values.

In another embodiment, the invention relates to troubleshooting a circuit in an integrated circuit chip. The simulation model includes predicted operational characteristics of the circuit. The operational characteristics include operating frequency values. The simulation model determines a previous input value and a next input value. The previous input value and the next input value are combined to generate a modeled input value. The expected output value is based upon the modeled input value. The circuit is tested under increasing frequency values until an error is seen. Operational characteristics are recorded and include operating frequency of the integrated circuit chip when the error is seen. The predicted operational characteristics are compared with the recorded operational characteristics.

In another embodiment, the invention relates to an apparatus for modeling the operation of a dynamic circuit which comprises means for determining a previous input value and a next input value. The previous input value and the next input value are combined to generate a modeled input value. An expected output value is based upon the modeled input value.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and it's numerous objects, features and advantages made apparent to those skilled in the art by referencing the accompanying drawings. The use of the same reference number throughout the figures designates a like or similar element.

Figure 1A:
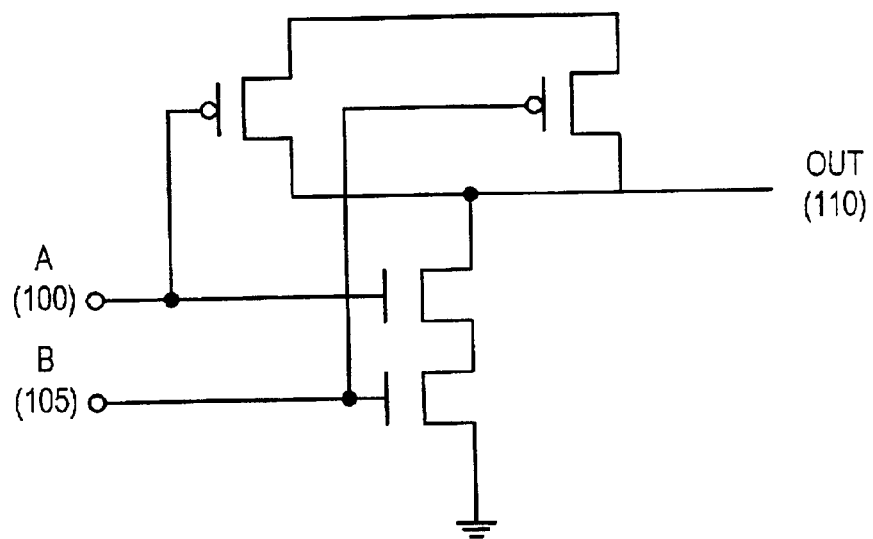
FIG. 1A is a schematic diagram of an example of a static CMOS circuit representing a NAND gate.
Figure 1B:
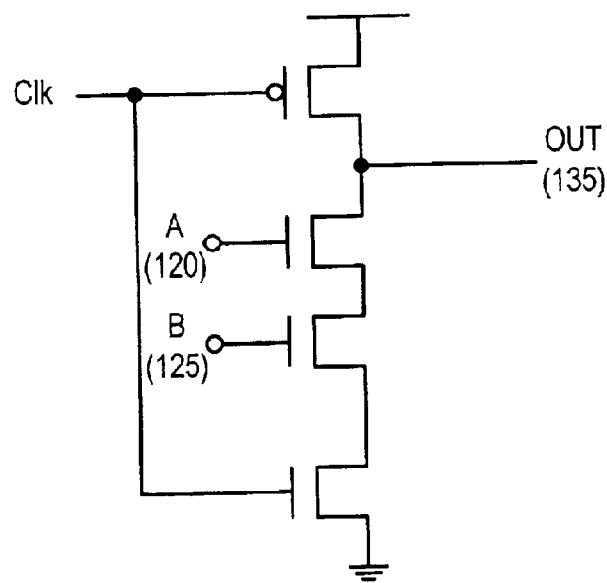
FIG. 1B is a schematic diagram of an example of a dynamic CMOS circuit representing a NAND gate.

While the invention is susceptible to various modifications and alternative forms (i.e., the invention can be used to verify if the predicted result matches the observed result), specific embodiments thereof are shown by way of example in the drawings and will herein be described in detail, it should be understood, however, that the drawings and detailed description thereto are not intended to limit the invention to the particular form disclosed but on the contrary, the intention is to cover all modifications, equivalents, and alternatives falling within the spirit and scope of the present invention as defined by the appended claims.

DETAILED DESCRIPTION

Figure 2:
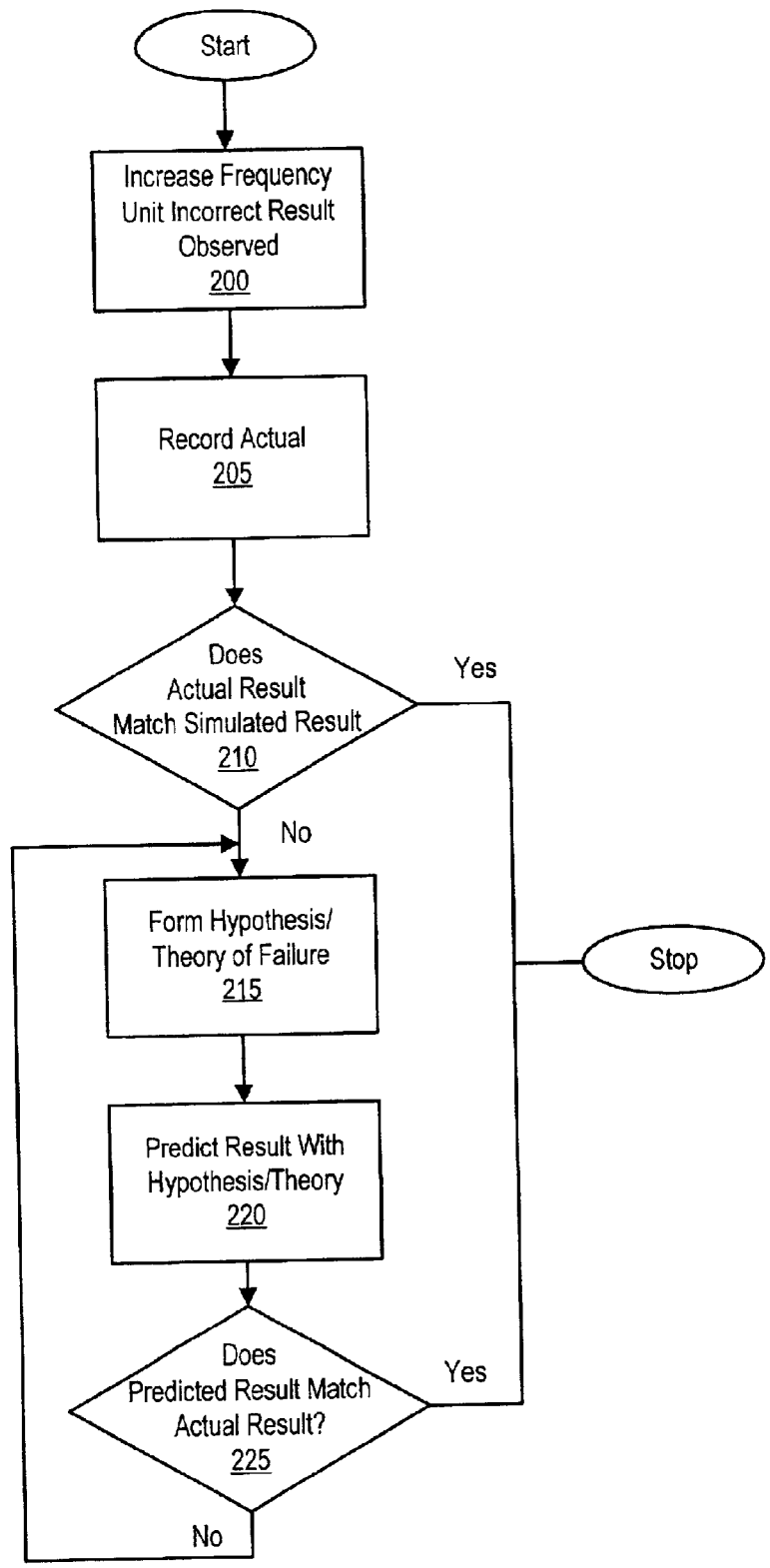
FIG. 2 is a flow chart showing the process of identifying frequencies and critical circuit paths.

FIG. 2 is a flow chart illustrating the process of identifying frequencies and critical circuit paths. If an integrated circuit chip is working properly in a system, then the clock frequency is increased until a failure is observed at step 200. When an output of the integrated circuit chip generates a failure, then the actual integrated circuit results (including the failure) are recorded at step 205. In step 210, from prior timing path simulation on the integrated circuit, simulation results are compared with the actual results of step 205. If the actual results of step 205 are the same as the simulated results, the simulation results are acceptable and properly model the actual behavior of the integrated circuit, and the process ends. If the actual results of step 205 are not the same as the simulated results, the simulation results do not model the actual behavior of the integrated circuit and are thus not acceptable. A new model or simulation is formed regarding circuit frequencies and operation at step 215.

Using the new model or simulation, where the new model or simulation can be a re-simulation of the integrated circuit, new simulation results are generated at step 220. In step 225, the new simulation results of step 220 are compared with the actual integrated circuit results recorded in step 205. If the new simulation results of step 220 match the actual results of step 205, the process ends. If the new simulation results of step 220 do not match the actual results of step 205, the process returns to step 215 for a different new model or simulation.

When developing models and simulations regarding probable failure conditions and critical paths, circuit simulation programs may be used. Circuit simulation programs include a number of SPICE circuit modeling programs and Verilog® language programs as set forth by the Institute of Electronics and Electrical Engineer (IEEE). A combination of simulation and other programs can be used in the process of debugging integrated circuit chips and in developing hypothesis and theory of behavior of circuits.

Quite often, critical path circuit simulation does not produce the exact correspondence between silicon and simulation. This could be due to many reasons including inaccuracy of transistor model, wire model, inaccuracy of parasitic resistance and capacitance extraction, approximation in delay calculation, etc. As a result, engineers do not know which critical path to fix to improve the performance of the chip. This issue is particularly prevalent when using dynamic circuitry along the critical path. Thus the present invention provides a tool that assists silicon debugging of critical path for dynamic circuits. The invention describes a method of modeling dynamic circuits in such a way that if critical path due to violation of input setup time to dynamic circuits is encountered, the RTL simulation predicts the output of the circuit. This predicted output result is compared with the actual result observed, the model is modified based on hypothesis until the simulator matches the observed silicon result. When the match occurs, the simulator accurately models the silicon, thus the engineer can determine which path to fix to improve the performance of the integrated circuit design.

Figure 3A:
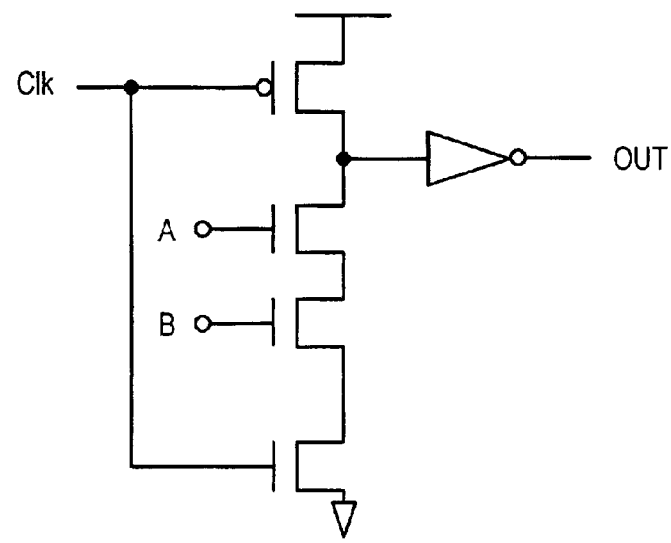
FIGS. 3A and 3B are schematic diagrams of an example of true and complement versions of a dynamic AND gate modeled according to the present invention.
Figure 3B:
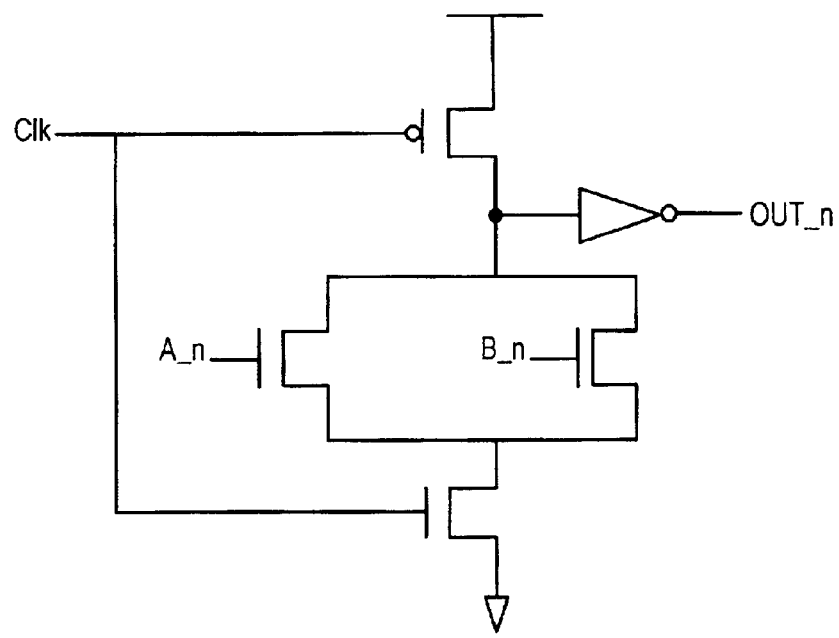

The present invention leverages an existing register transfer level (RTL) model of an integrated circuit chip to predict the incorrect result observed in silicon. When modeling dynamic circuits, these circuits behave like static circuits only when the following criteria are met: the dynamic input only rises during evaluation phase, the dynamic input if need to fall, falls during the pre-charge phase and the output of the dynamic circuit is valid during the evaluation phase after all inputs have settled. FIGS. 3A and 3B show an example of a dynamic AND circuit.

The invention describes a simulator that predicts the behavior of a dynamic circuit when the dynamic input falls during the evaluation phase. More specifically, under normal operating conditions, the inputs A and B are settled when the evaluation clock arrives and thus OUT and OUT_n evaluate to the correct logic level. (The nomenclature "_n" indicates the naught or complement of a signal.) However, if A_n is derived from another inverter and if A_n fails to fall before the evaluation clock arrives, and B_n is low, then OUT_n will be incorrectly evaluated to be high. (The same would be true if A_n is low and B_n fails to fall before the evaluation clock arrives.) In this case, OUT and OUT_n are no longer the complement of each other, and thus any subsequent logic using the OUT signal will produce and incorrect result.

Accordingly, the present invention provides a model of the behavior of this dynamic logic which captures rise/fall transitions by using the previous logic value as well as the next logic value of the input signals to model the behavior of the circuit. Assuming that the falling edge of A_n failed to meet the setup time, A_n is modeled as:

$$A\_n = A\_n_{prev} | A\_n_{next}$$

Accordingly, the RTL for this circuit is modified to mimic the behaviors when the dynamic circuit setup time is violated. Leveraging the existing RTL module, the subsequent logic is evaluated accordingly. As such, the result of the operation of the integrated circuit can be predicted.

Figure 4:
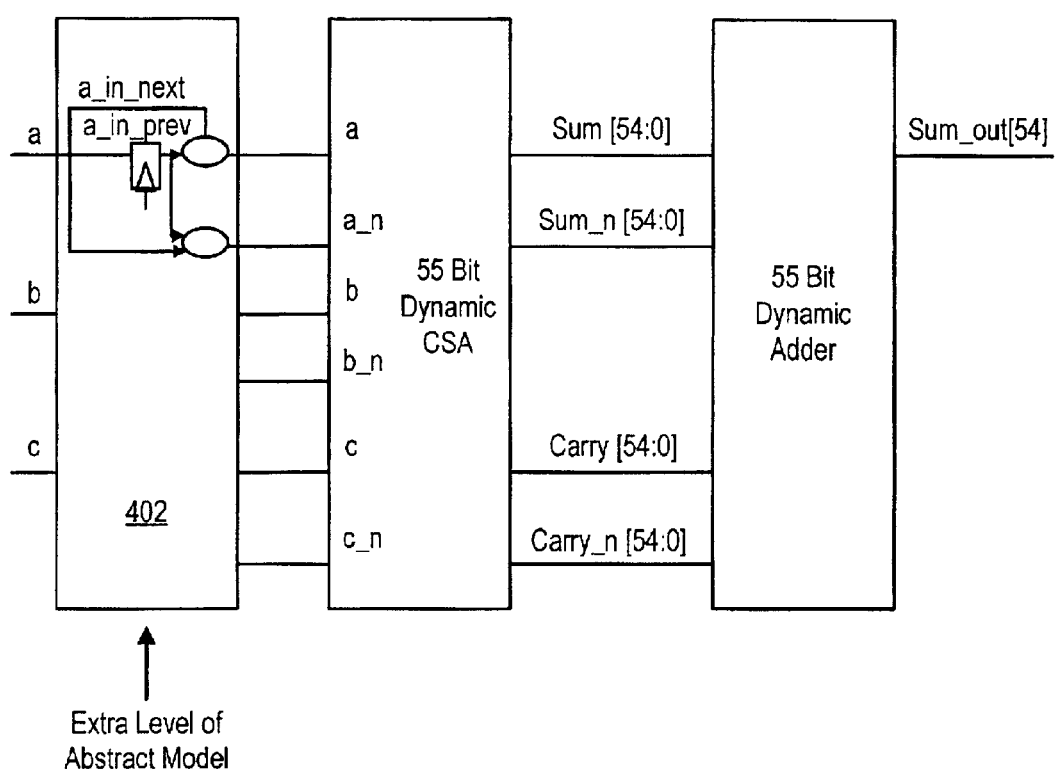
FIG. 4 is a block diagram of a model of an adder circuit modeled according to the present invention.

The modeling can be applied in any RTL language. The example below illustrates the model written in Verilog® language for a carry sum adder (csa) used within a cascaded adder circuit. FIG. 4 shows a block diagram of the circuit that the simulation is modeling. More specifically, the following is a module definition for use in a Verilog® program debugging session. The program module in this example is titled "csa" (for carry sum adder) and is representative of the dynamic csa module for simulating the functioning of the adder circuit shown in FIG. 4.

```
module csa( )
        a_in_prev,
        a_in_next,
        b_in_prev,
        b_in_next,
        c_in_prev,
        c_in_next,
        sum,
        sum_n,
        carry,
        carry_n
);
input   [54:0] a_in_prev;
input   [54:0] a_in_next;
input   [54:0] b_in_prev;
input   [54:0] b_in_next;
input   [54:0] c_in_prev;
input   [54:0] c_in_next;
output  [54:0] sum;
output  [54:0] sum_n;
output  [54:0] carry;
output  [54:0] carry_n;
wire    [54:0] a;
wire    [54:0] a_n;
wire    [54:0] b;
wire    [54:0] b_n;
wire    [54:0] c;
wire    [54:0] c_n;
assign  a[54:0] = ( a_in_prev[54:0] & a_in_next[54:0]) |
                  (~a_in_prev[54:0] & a_in_next[54:0]) |
                  ( a_in_prev[54:0] & ~a_in_next[54:0]);
assign  a_n[54:0] = (~a_in_prev[54:0] & ~a_in_next[54:0]) |
//                  (~a_in_prev[54:0] & a_in_next[54:0]) |
                    ( a_in_prev[54:0] & ~a_in_next[54:0]);
assign  b[54:0] = ( b_in_prev[54:0] & b_in_next[54:0]) |
                  (~b_in_prev[54:0] & b_in_next[54:0]) |
                  ( b_in_prev[54:0] & ~b_in_next[54:0]);
assign  b_n[54:0] = (~b_in_prev[54:0] & ~b_in_next[54:0]) |
//                  (~b_in_prev[54:0] & b_in_next[54:0]) |
                    ( b_in_prev[54:0] & ~b_in_next[54:0]);
assign  c[54:0] = ( c_in_prev[54:0] & c_in_next[54:0]) |
                  (~c_in_prev[54:0] & c_in_next[54:0]) |
                  ( c_in_prev[54:0] & ~c_in_next[54:0]);
assign  c_n[54:0] = (~c_in_prev[54:0] & ~c_in_next[54:0]) |
//                  (~c_in_prev[54:0] & c_in_next[54:0]) |
                    ( c_in_prev[54:0] & ~c_in_next[54:0]);
assign  sum[54:0] = (a_n & b_n & c ) |
                    (a & b & c ) |
                    (a_n & b & c_n) |
                    (a & b_n & c_n);
assign  sum_n[54:0] = (a & b_n & c ) |
                      (a_n & b & c ) |
                      (a & b & c_n) |
                      (a_n & b_n & c_n);
assign  carry[54:0] = (a & b) |
                      (a & c) |
                      (b & c);
assign  carry_n[54:0] = (a_n & b_n) |
                        (a_n & c_n) |
                        (b_n & c_n);
endmodule
```

In this example, the first stage of the adder 402 is used to provide an additional level of abstraction of the adder which then propagates down the stages of the adder. A carry sum adder compresses three inputs into two outputs, a sum and a carry. The combination of the sum and the carry provide the result of the addition. The additional level of abstraction is provided via the values a_in_prev, b_in_prev, and c_in_prev. A_in_prev can be captured using flops with the inputs tied to a (a=a_in_next). A combination of a_in_next and a_in_prev is used to generate a and a_n.

The example models the case when the falling edge of a, b, or c fail to meet the setup time of the dynamic inputs. Different combinations of timing violations can be simulated to match the observed result from silicon, e.g., by commenting out various combinations of inputs. See for example, the commenting of assign a_n[54:0]=(~a_in_prev[54:0] & a_in_next[54:0]) in the assign a_n[54:0] model and the commenting of assign b_n[54:0]=(~b_in_prev[54:0] & b_in_next[54:0]) in the assign b_n[54:0] model.

Although the present invention has been described in connection with several embodiments, the invention is not intended to be limited to the specific forms set forth herein, but on the contrary, it is intended to cover such alternatives, modifications, and equivalents as can be reasonably included within the spirit and scope of the invention as defined by the appended claims.

What is claimed is:

1. A method of modeling operation of a dynamic circuit comprising:

determining a previous input value;

determining a next input value;

combining the previous input value and the next input value to generate a modeled input value; and modeling an expected output value based upon the modeled input value, wherein the modeling models a case where a falling edge of the input value fails to meet a setup time for the dynamic circuit.

2. The method of modeling operation of a dynamic circuit of claim 1 wherein the modeling is based upon a register transfer level model.

3. The method of modeling operation of a dynamic circuit of claim 1 wherein the previous input value is determined by holding an input value for a clock cycle.

4. The method of modeling operation of a dynamic circuit of claim 1 wherein the modeling includes modeling a true expected output value and a complement expected output value.

5. A method of modeling operation of a dynamic circuit comprising:

determining first and second previous input values;

determining first and second next input values;

combining the first previous input value and the first next input value to generate a first modeled input value;

combining the second previous input value and the second next input value to generate a second modeled input value; and modeling first and second expected output values based upon the first and second modeled input values, wherein the modeling models a case where a falling edge of the first and second input values fail to meet a setup time for the dynamic circuit.

6. The method of modeling operation of a dynamic circuit of claim 5 wherein the modeling is based upon a register transfer level model.

7. The method of modeling operation of a dynamic circuit of claim 5 wherein the first and second previous input values are determined by holding respective first and second input values for a clock cycle.

8. The method of modeling operation of a dynamic circuit of claim 5 wherein the modeling includes modeling a first true expected output value and a first complement expected output value and modeling a second true expected output value and a second complement expected output value.

9. A method for troubleshooting a circuit in an integrated circuit chip comprised of:
developing a simulation model comprised of predicted operational characteristics of the circuit, wherein the operational characteristics comprise operating frequency values, the developing a simulation model including
determining a previous input value;
determining a next input value;
combining the previous input value and the next input value to generate a modeled input value; and
modeling an expected output value based upon the modeled input value;
testing the circuit under increasing frequency values until an error is seen;
recording operational characteristics wherein the recorded operational characteristics include operating frequency of the integrated circuit chip when the error is seen; and
comparing the predicted operational characteristics with the recorded operational characteristics.

10. The method for troubleshooting a circuit of claim 9 wherein the circuit is a dynamic circuit.

11. The method for troubleshooting a circuit of claim 9 further comprising:
developing a revised simulation model with revised predicted operational characteristics;
re-testing the circuit;
recording operational characteristics from the re-testing of the circuit; and
comparing the revised predicted operational characteristics with the recorded operational characteristics of the re-testing.

12. An apparatus for modeling the operation of a dynamic circuit comprising:
means for determining a previous input value;
means for determining a next input value;
means for combining the previous input value and the next input value to generate a modeled input value; and
means for modeling an expected output value based upon the modeled input value, wherein the means for modeling models a case where a falling edge of the input value fails to meet a setup time for the dynamic circuit.

13. The apparatus for modeling operation of a dynamic circuit of claim 12 wherein
the modeling is based upon a register transfer level model.

14. The apparatus for madding operation of a dynamic circuit of claim 12 further comprising
means for holding an input value; and wherein
the previous input value is determined based upon the input value.

15. The apparatus for modeling operation of a dynamic circuit of claim 12 wherein the means for modeling includes means for modeling a true expected output value and a complement expected output value.

* * * * *